United States Patent
Mann et al.

(10) Patent No.: US 9,013,677 B2
(45) Date of Patent: Apr. 21, 2015

(54) IMAGING OPTICS, MICROLITHOGRAPHY PROJECTION EXPOSURE APPARATUS HAVING SAME AND RELATED METHODS

(75) Inventors: Hans-Juergen Mann, Oberkochen (DE); David Shafer, Fairfield, CT (US)

(73) Assignee: Carl Zeiss SMT GmbH, Oberkochen (DE)

( * ) Notice: Subject to any disclaimer, the term of this patent is extended or adjusted under 35 U.S.C. 154(b) by 323 days.

(21) Appl. No.: 13/602,553

(22) Filed: Sep. 4, 2012

(65) Prior Publication Data
US 2013/0050671 A1 Feb. 28, 2013

Related U.S. Application Data

(63) Continuation of application No. PCT/EP2011/001671, filed on Apr. 2, 2011.

(60) Provisional application No. 61/326,700, filed on Apr. 22, 2010.

(51) Int. Cl.
| | | |
|---|---|---|
| G03B 27/54 | (2006.01) | |
| G03B 27/42 | (2006.01) | |
| G03F 7/20 | (2006.01) | |
| G02B 17/06 | (2006.01) | |

(52) U.S. Cl.
CPC ........ *G03F 7/70233* (2013.01); *G02B 17/0657* (2013.01); *G02B 17/0663* (2013.01)

(58) Field of Classification Search
CPC .......................... G03F 7/70225; G03F 7/70275
USPC .......................................... 355/52, 53, 55, 67
See application file for complete search history.

(56) References Cited

U.S. PATENT DOCUMENTS

| | | | |
|---|---|---|---|
| 5,071,240 A | 12/1991 | Ichihara et al. | |
| 7,375,798 B2 * | 5/2008 | Hudyma et al. | ............... 355/67 |
| 7,920,338 B2 * | 4/2011 | Ulrich et al. | ................. 359/727 |
| 2004/0114217 A1 | 6/2004 | Mann et al. | |
| 2006/0232867 A1 | 10/2006 | Mann et al. | |

(Continued)

FOREIGN PATENT DOCUMENTS

| | | |
|---|---|---|
| WO | WO 2010/006678 | 1/2010 |
| WO | WO 2010/091800 | 8/2010 |

OTHER PUBLICATIONS

International Search Report and Written Opinion for corresponding PCT Appl No. PCT/EP2011/001671, mailed Jul. 7, 2011.
D. Korsch, *Reflective Optics*, chapter 8.5 "The focusing telescope," Academic Press, Inc., San Diego, 1991, p. 163.

(Continued)

*Primary Examiner* — Hung Henry Nguyen
(74) *Attorney, Agent, or Firm* — Fish & Richardson P.C.

(57) ABSTRACT

An imaging optics has a plurality of mirrors to image an object field in an object plane into an image field in an image plane. The imaging optics includes a first partial objective to image the object field onto an intermediate image, and the imaging optics includes a second partial objective to image the intermediate image onto the image field. The second partial objective includes a penultimate mirror in the beam path of imaging light between the object field and the image field, and the second partial objective includes a last mirror in the beam path. The penultimate mirror images the intermediate image onto a further intermediate image, and the last mirror images the further intermediate image onto the image field.

20 Claims, 9 Drawing Sheets

(56) References Cited

U.S. PATENT DOCUMENTS

2007/0058269 A1     3/2007    Mann et al.
2008/0170310 A1     7/2008    Mann et al.

OTHER PUBLICATIONS

D. Korsch, "Two-Mirror Configurations," Jan. 1, 1991, Reflective Optics, Academic Press Limited, London, pp. 154-157.

D. Korsch, "Third Order Correction of Three-Mirror Systems," Jan. 1, 1991, Reflective Optics, A. cademic Press Limited, London, pp. 207-211.

Goncharov, "Future Giant Telescopes: integration of MCAO in Telescope Design," SPIE, PO Box 10 Bellingham, WA, USA, Dec. 12, 2008.

H.J. Mann, "Reflective high-NA projection lenses," SPIE, PO Box 10 Bellingham, WA, USA, Dec. 12, 2005.

R. Hudyma, "An Overview of Optical Systems for 30nm Resolution Lithography at EUV Wavelengths," Proceedings of SPIE, SPIE, USA, vol. 4832, Dec. 1, 2002, pp. 137-148.

Taiwanese Office Action, with English translation thereof, for TW Patent Appl. No. 100113866, received Nov. 1, 2013.

\* cited by examiner

IMAGING OPTICS, MICROLITHOGRAPHY PROJECTION EXPOSURE APPARATUS HAVING SAME AND RELATED METHODS

CROSS-REFERENCE TO RELATED APPLICATIONS

This application is a continuation of, and claims benefit under 35 USC 120 to, international application PCT/EP2011/001671, filed Apr. 2, 2011, which claims benefit under 35 USC 119(e) of U.S. Ser. No. 61/326,700, filed Apr. 22, 2010. International application PCT/EP2011/001671 is hereby incorporated by reference in its entirety.

FIELD

The disclosure relates to an imaging optics having a plurality of mirrors that image an object field in an object plane into an image field in an image plane. The disclosure also relates to a projection exposure apparatus having such an optics, and to a method for producing a microstructured component with the aid of such a projection exposure apparatus.

BACKGROUND

US 2006/0232867 A1 and US 2008/0170310 A1 disclose imaging optics having a plurality of mirrors that image an object field in an object plane into an image field in an image plane of the type mentioned at the beginning are known from. The imaging optics include a first partial objective that images the object field onto an intermediate image, and the imaging optics include a second partial objective that images the intermediate image onto the image field. The second partial objective includes a penultimate mirror in the beam path of the imaging light between the object field and the image field, and the second partial objective includes a last mirror in the beam path.

SUMMARY

The disclosure provides an imaging optics in which the last mirror has a relatively small diameter.

In one aspect, the disclosure provides an imaging optics having a plurality of mirrors that image an object field in an object plane into an image field in an image plane. The imaging optics includes a first partial objective that images the object field onto an intermediate image, and a second partial objective that images the intermediate image onto the image field. The second partial objective includes a penultimate mirror in the beam path of the imaging light between the object field and the image field, and the second partial objective includes a last mirror in the beam path. The penultimate mirror and the last mirror are designed so that the penultimate mirror images the intermediate image onto a further intermediate image, and the last mirror images the further intermediate image onto the image field.

Because the imaging optics is designed so that a further intermediate image is located in the beam path between the penultimate mirror and the last mirror, the diameter of the last mirror can be relatively small. Because of the further intermediate image, the optical refractive power, and thus the curvature of the last mirror, is increased by comparison with an imaging optics without an intermediate image between the penultimate mirror and the last mirror to image the intermediate image onto the image field with the last mirror. The stronger curvature of the last mirror leads to enlargement of the sagitta, particularly at the edge of the mirror. The diameter of the last mirror is therefore decreased.

In the case of the imaging optics, both the object plane and the image plane are located at a finite distance from the imaging optics. The distance is to be regarded as finite whenever the distance between the object plane and an optical component situated closest to the object plane, or the distance between the image plane and an optical component situated closest to the image plane, is smaller than 5 m.

As used herein, an intermediate image is a real image of the object field that is not the image field, but is first imaged into the image field by a further imaging.

As used herein, a partial objective is an arrangement of one or more optical components that images either the object field of the imaging optics onto a real intermediate image, or images a real intermediate image onto a further real intermediate image, or a real intermediate image onto the image field of the imaging optics. Consequently, in the case of a partial objective an intermediate image of the imaging optics is either the object field of the partial objective, or the image field of the partial objective, or both the object field and the image field of the partial objective. A partial objective can in this case include, in turn, two or more partial objectives. Since the second partial objective includes an intermediate image between the two mirrors of the second partial objective, the second partial objective in turn includes two partial objectives. One partial objective includes the penultimate mirror, while the other partial objective includes the last mirror.

Here, the last mirror is the mirror arranged in the beam path directly upstream of the image plane while the penultimate mirror is the mirror arranged in the beam path directly upstream of the last mirror.

The penultimate mirror has a positive optical refractive power in order to image the intermediate image onto the further intermediate image. In one embodiment, the penultimate mirror is designed as a concave mirror.

The last mirror likewise has a positive optical refractive power in order to image the further intermediate image onto the image field. In one embodiment, the last mirror is designed as a concave mirror.

In one embodiment, the last mirror has a through-opening for the passage of the imaging light. Consequently, the numerical aperture in the image field can be increased by comparison with an imaging optics having a last mirror without a through-opening. Specifically, if the last mirror were to have no through-opening for the imaging light, the beam path would have to be guided past the last mirror. Given an increase in the numerical aperture, this would lead to larger incidence angles of the light rays on the penultimate mirror and the last mirror. The through-opening inside the optically used area of the last mirror has the effect that the last mirror does not reflect the entire imaging light bundle. In accordance with the size of the through-opening, an obscuration of the pupil illumination, the so-called pupil obscuration, comes about. The optically used area is in this case that area of the mirror which is struck by the imaging light.

In one embodiment, the penultimate mirror has no through-opening for the passage of the imaging light inside its optically used area. This does not preclude the penultimate mirror having a through-opening for the passage of the imaging light outside the optically used area. Specifically, it can be advantageous for mechanical reasons to enlarge the physical extent of the penultimate mirror beyond the optically used area. This can result in the use of a through-opening for the passage of the imaging light in the penultimate mirror outside the optically used area.

In one embodiment, the penultimate mirror is arranged outside an imaging light bundle between the last mirror and the image field. The imaging light bundle includes all light rays that emanate from the entire object field and completely fill up the aperture stop of the imaging optics.

Given that the penultimate mirror has no through-opening for the passage of the imaging light inside its optically used area and is arranged outside the imaging light bundle between the last mirror and the image field, the penultimate mirror exerts no influence on the pupil obscuration.

Moreover, it is possible to attain a sufficiently large working distance between the penultimate mirror and the image plane. In one embodiment, the ratio of the outside diameter of the penultimate mirror to the working distance between the penultimate mirror and the image plane is smaller than 5. The outside diameter of a mirror is defined as the diameter of that circle which, on the one hand, encloses the optically used area on a mirror, and, on the other hand, has the smallest radius. The optically used area includes the impingement points of all the light rays of the imaging light bundle on the mirror. The working distance of a mirror is defined as the minimum distance of a point on the mirror surface from the image plane, the distance being measured perpendicular to the image plane. If the ratio of the outside diameter of the penultimate mirror to the working distance between the penultimate mirror and the image plane has a value of greater than 5, the risk exists that the penultimate mirror will become unstable because of the excessively small thickness of the mirror.

In one embodiment, the ratio of the outside diameter of the penultimate mirror to the working distance between the penultimate mirror and the image plane is smaller than 2.

In one embodiment, the outside diameter of the penultimate mirror is smaller than the outside diameter of the last mirror. In this case, the second partial objective leads to an increase in the numerical aperture between the intermediate image and the image field. This enables the numerical aperture in the first partial objective and in the second partial objective to be increased in two steps.

In another embodiment, the penultimate mirror has a through-opening for the passage of the imaging light inside the optically used area of the penultimate mirror. This configuration arises, for example, when the penultimate mirror and the last mirror have a common axis of symmetry to which the mathematical description of the surface of the two mirror surfaces is rotationally symmetric. The imaging light reflected at the last mirror passes through the through-opening in the penultimate mirror on the light path to the image plane.

At least one of the mirrors or the imaging optics can have a reflecting surface that is designed as a free form surface that can not be described by a rotationally symmetric function.

Such free form surfaces for reflecting surfaces of the mirrors of projection objectives of projection exposure apparatus for microlithography are known from US 2007/0058269 A1. They can, for example, be generated from a rotationally symmetric reference surface.

A free form surface can be described mathematically by the following equation:

$$Z = \frac{cr^2}{1 + \sqrt{1 - (1+k)c^2 r^2}} + \sum_{j=2}^{N} \frac{C_j}{R_{norm}^{n+m}} X^m Y^n \quad (1)$$

in which it holds that:

$$j = \frac{(m+n)^2 + m + 3n}{2} + 1. \quad (2)$$

Z is the sagitta of the free form surface at the point X, Y ($X^2+Y^2=r^2$). r is the radial distance of the local surface coordinate system. c is a constant that corresponds to the apex curvature.

k corresponds to a conic constant. $C_j$ are the coefficients of the monomials $X^m Y^n$. $R_{norm}$ is the normalization factor for the coefficients. The values of c, k and $C_j$ are typically determined on the basis of the desired optical properties of the mirror inside the imaging optics. The order of the monomial, m+n, can be varied at will. A monomial of higher order can lead to a design of the imaging optics with better aberration correction, but is more complicated to calculate. m+n can assume values between 3 and more than 20.

Free form surfaces can also be described mathematically by Zernike polynominals that are explained, for example, in the manual of the optical design program CODE V®. Alternatively, free form surfaces can be described with the aid of two-dimensional spline surfaces. Examples of this are Bezier curves or non-uniform rational basis splines (NURBS). Two-dimensional spline surfaces can be described, for example, by a network of points in an xy-plane and associated z-values, or by these points and gradients associated therewith. Depending on the respective type of the spline surface, the complete surface is obtained by interpolation between the network points with the use, for example, of polynomials or functions that have specific properties with regard to their continuity and differentiability. Analytical functions are examples of this.

The free form surfaces preferably have a maximum deviation of at least the absolute value of the wavelength of the imaging light from a rotationally symmetric surface—that need not correspond to a design reference surface—best adapted to the free form surface. In the case of illumination with EUV wavelengths, that is to say wavelengths of 5 nm to 30 nm, this deviation is at least a few 10 nm, for example 50 nm. Larger deviations, for example, of 100 nm, 500 nm, 1 µm or even yet larger deviations in the region of millimeters are also possible. Even yet higher deviations are possible when use is made of systems with imaging light of a higher wavelength.

In this case, it is possible to design a single mirror of the imaging optics as a free form surface, or to design a plurality of, or else all, the mirrors of the imaging optics as free form surfaces.

The use of free form surfaces instead of reflecting surfaces having an axis of rotational symmetry creates new degrees of design freedom, and this leads to imaging optics having combinations of properties that can not be implemented with rotationally symmetric reflecting surfaces. It is precisely for imaging optics having a through-opening in the last mirror that the use of free form surfaces offers the possibility of implementing compact imaging optics with small aberrations and, in particular, a high light throughput. Owing to the use of free form surfaces, the penultimate mirror can be implemented without a through-opening for the passage of the imaging light inside the optically used area because the penultimate mirror is arranged in a decentered fashion.

In one embodiment, the intermediate image is arranged in the region of the through-opening of the last mirror, which means that the through-opening is of small extent. Eventually, this leads to a small obscuration of the imaging light bundle when it strikes the last mirror. To the extent that the last mirror is the sole mirror with a through-opening, the ratio of the extent of the through-opening to the extent of the last mirror approximately determines the size of the pupil obscuration.

In one embodiment, the first partial objective includes four mirrors.

In one embodiment, the first mirror in the beam path from the object field to the intermediate image has a positive optical refractive power, the third mirror in the beam path has a negative optical refractive power, and the fourth mirror in the beam path has a positive optical refractive power.

In one embodiment, the imaging optics has exactly six mirrors.

The number of the mirrors influences the transmission of the imaging optics. The smaller the number of the mirrors, the larger is the transmission of the imaging optics. This holds to a particular extent for imaging optics in the case of EUV wavelengths, since the reflectivity of EUV mirrors is approximately at most 70% when light is incident perpendicularly, or virtually so.

In one embodiment, the imaging optics is a catoptric objective. Consequently, exclusively mirrors that are used as imaging optical elements are used. Catoptric objectives are particularly suitable for imaging light with wavelengths for which no transparent optical materials are available.

In one embodiment, all the light rays on all the mirrors have an incidence angle of smaller than 45° with respect to the surface normal at the location of the impingement point of a light ray.

A numerical aperture in the image plane of at least 0.3 enables a high resolution of the imaging optics.

In one embodiment, the numerical aperture is at least 0.4.

In one embodiment, the numerical aperture is at least 0.5.

Numerical apertures of up to 0.8 can be implemented by increasing the degrees of design freedom by increasing the number of mirrors or using aspheric surfaces or free form surfaces.

In one embodiment, the object field is rectangular. This facilitates the process management when the imaging optics is used, in particular, as a projection objective in a projection exposure apparatus. Such a rectangular field can be achieved, in particular, by the use of nonrotationally symmetrical free form surfaces as reflecting surfaces of the mirrors of the imaging optics. The image field can have an extent of between 2 mm and 6 mm on the short side, and an extent of between 12 mm and 26 mm on the long side.

In another embodiment, the object field can also have the shape of an annular field segment. This is advantageous whenever the optical surfaces of all the optical components can be described by mathematical functions that are rotationally symmetric in relation to an optical axis passing through.

When the imaging optics is used as a projection objective for microlithography, their advantages come to bear particularly well.

The advantages of an inventive projection exposure apparatus having an inventive imaging optics as a projection objective correspond to those that were mentioned above with reference to the imaging optics.

The light source of the projection exposure apparatus can be designed to generate EUV illumination light with a wavelength between 5 nm and 30 nm.

Corresponding advantages hold for an inventive production method and for the microstructured component produced hereby.

BRIEF DESCRIPTION OF THE DRAWINGS

The disclosure is explained in more detail below with the aid of the drawings, in which.

DETAILED DESCRIPTION

Figure 1:
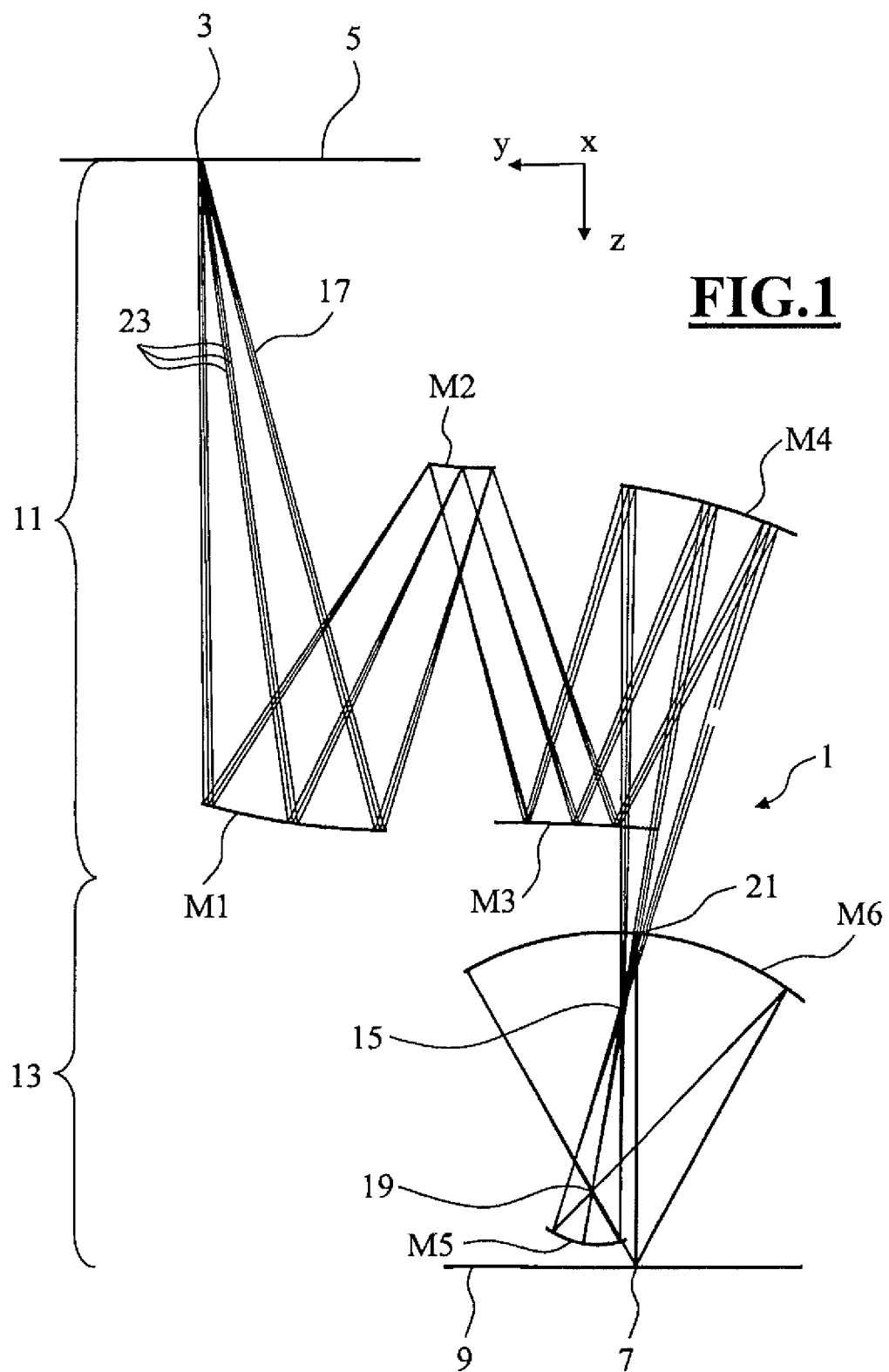
FIG. 1 shows in meridional section an embodiment of an imaging optics having a penultimate mirror without a through-opening.
Figure 2:
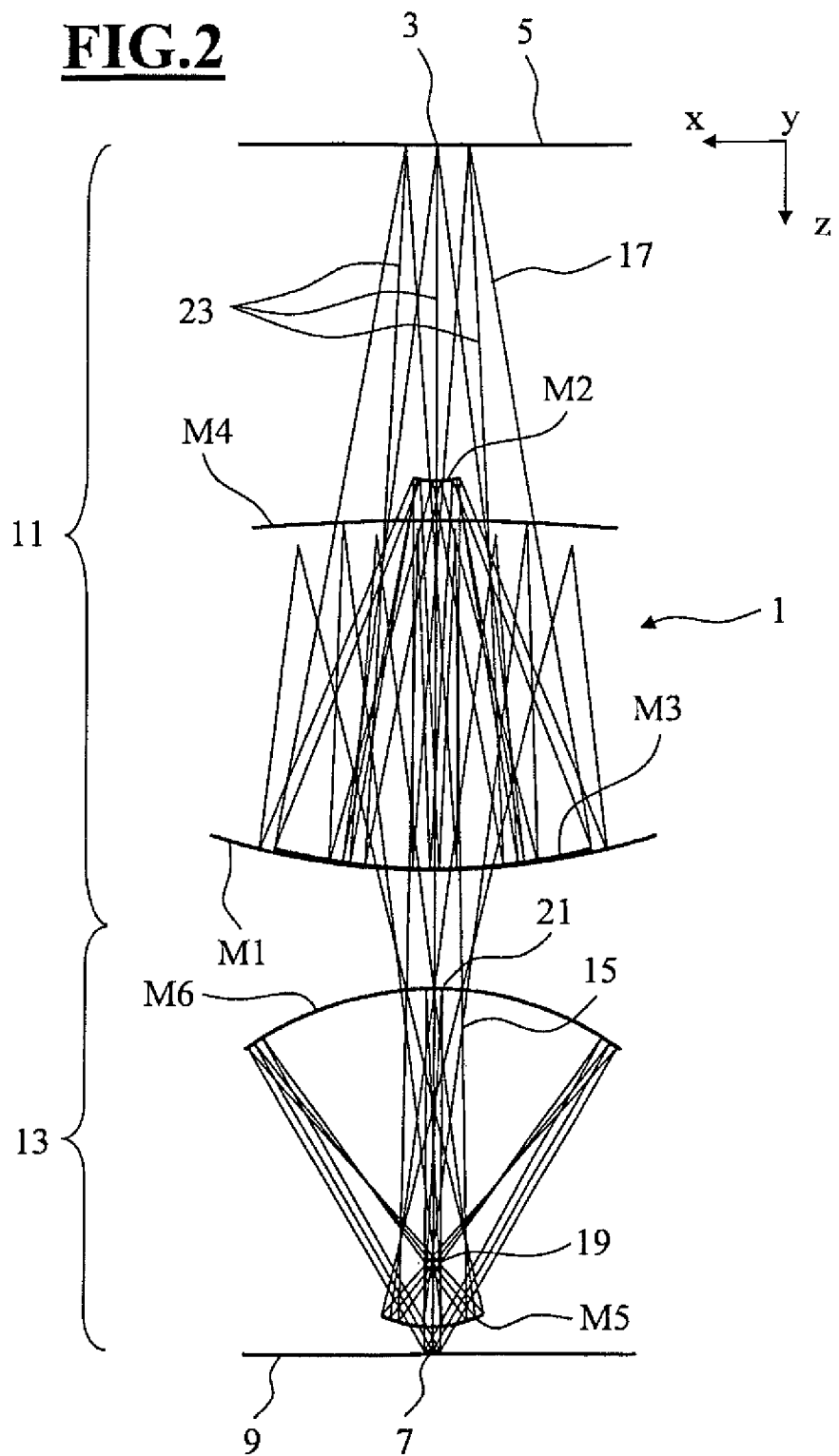
FIG. 2 shows in sagittal section the embodiment of FIG. 1.

FIG. 1 shows an embodiment of an imaging optics 1 in meridional section. A meridional section is understood in the sense of this application as a section through the imaging optics in a plane of symmetry of the imaging optics. FIG. 2 shows in this regard the same embodiment in sagittal section. A sagittal section is understood in the sense of this application as a section in a plane that is perpendicular to the plane of symmetry of the imaging optics. Here, the mirrors are depicted as sectional lines in this plane, and the light rays are depicted as a projection into this plane. The imaging optics 1 images an object field 3 in an object plane 5 into an image field 7 in an image plane 9. The imaging optics 1 has six mirrors that are enumerated as M1 to M6 in the sequence of the beam path starting from the object field 3. The imaging optics 1 is a catoptric objective.

The object field 3 is rectangular and has an extent of 8 mm in the y-direction and an extent of 104 mm in the x-direction. The imaging scale of the imaging optics 1 is 0.25 such that the image field 7 has an extent of 2 mm in the y-direction and an extent of 26 mm in the x-direction.

The image-side numerical aperture NA is 0.5.

The imaging optics 1 includes a first partial objective 11 that images the object field 3 onto an intermediate image 15, and a second partial objective 13 that images the intermediate image 15 onto the image field 7. The first partial objective includes the four mirrors M1 to M4. The second partial objective 13 includes a penultimate mirror M5 in the beam path of the imaging light 17 between the object field 3 and the image field 7, and a last mirror M6 in the beam path. The penultimate mirror M5 is designed as a concave mirror and images the intermediate image 15 onto a further intermediate image 19. The last mirror M6 is likewise designed as a concave mirror and images the further intermediate image 19 onto the image field 7.

The optical data for the imaging optics 1 are assembled in tables 1a, 1b and 1c. Table 1a specifies for the optical surfaces of the mirrors M1 to M6 respectively the reciprocal (radius) of the apex curvature c, and a distance value that corresponds to the z-distance of adjacent elements in the beam path, starting from the object plane. The z-distance relates in this case to a global reference coordinate system whose origin and whose x-axis and y-axis lie in the object plane. Table 1b specifies the coefficients $C_j$ of the monomials $X^m Y^n$ in the above specified free form surface equation (1) for the mirrors M1 to M6. $R_{norm}$ in this case represents a normalization factor. Furthermore, table 1c has the absolute value in millimeters and in degrees, as appropriate, along which, starting from the global reference coordinate system, the respective mirror was decentered (Y decentering) and rotated (X-rotation). This corresponds to a parallel displacement and a tilting in the case of the free form surface design method. Here, there is displacement in the y-direction and rotation about the x-axis.

The reflecting surfaces of all six mirrors M1 to M6 are designed in accordance with the above specified formulas (1) and (2) as a free form surface that can be described with a rotationally asymmetric function.

Mirrors M1, M4, M5 and M6 are designed as concave mirrors. The mirror M2 is designed as a convex mirror. The mirror M3 has a saddle surface as reflecting surface.

The mirrors M1 and M6 and mirrors M3 and M6 are arranged back to back as to the orientation of their reflecting surfaces.

Illustrated in the meridional section of FIG. 1 is the beam path of in each case three individual rays that emanate from three object field points spaced apart from one another in the y-direction in FIG. 1. The three individual rays, which belong to one of these three object field points, represent the chief ray 23 and two aperture rays. Likewise in the sagittal section of FIG. 2 is the beam path of in each case three individual rays, which emanate from three object field points spaced apart from one another in the x-direction in FIG. 2. The three individual rays belonging to one of these three object field points represent the chief ray 23 and two aperture rays. The chief rays 23 run perpendicular to the image plane 7 in the image field 9. The aperture rays are at an angle to the respective chief ray that corresponds to the image-side numerical aperture. The chief rays 23 are depicted in FIG. 1 merely for illustrative purposes since, because of the pupil obscuration of the imaging optics 1, it is not real rays of the imaging optics 1 that are involved here, but virtual ones. These chief rays 23 initially run divergently relative to one another, emanating from the object plane 5. This is also denoted below as negative back focus of the entrance pupil of the imaging optics 1. The entrance pupil of the imaging optics 1 according to FIG. 1 lies not inside the imaging optics 1, but in the beam path upstream of the object plane 5. By way of example, it is thereby possible in the beam path upstream of the imaging optics 1 to arrange a pupil component of the illumination optics in the entrance pupil of the imaging optics 1 without further imaging optical components having to be present between this pupil component and the object plane 5.

The imaging optics 1 is designed so that the imaging light 17 runs as far as the intermediate image 15 without the imaging light bundle crossing over between the individual mirrors.

Inside the optically used area, the optically used areas of the mirrors M1 to M4 have no through-opening for the passage of imaging light 17. The mirror M5, that is to say the penultimate mirror in the beam path of the imaging light 17 between the object field 3 and the image field 7, also has no through-opening for the passage of the imaging light 17 inside the optically used area.

The mirror M5 is arranged outside an imaging light bundle between the last mirror M6 and the image field 7.

The mirror M6, that is to say the last mirror in the beam path of the imaging light 17 between the object field 3 and the image field 7, has a through-opening for the passage of the imaging light 17. The imaging light 17 passes through the through-opening 21 in the mirror M6 in the beam path between the mirrors M4 and M5. The mirror M6 is used around the through-opening 21.

Figure 3:
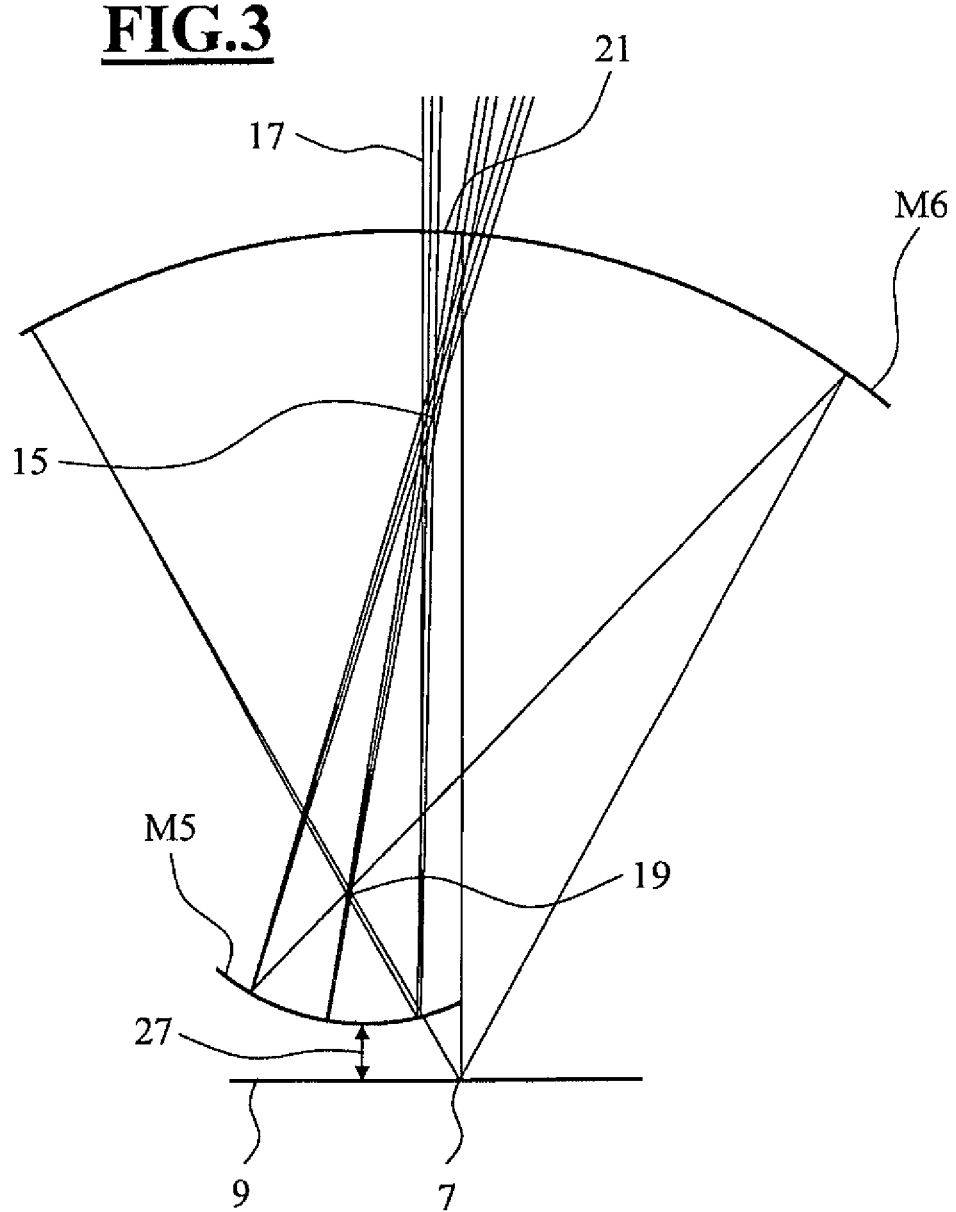
FIG. 3 shows a detailed from the meridional section of FIG. 1.

FIG. 3 serves to explain how the working distance between the penultimate mirror M5 and the image plane 5 is determined. A detail from the imaging optics in accordance with FIG. 1, specifically the second partial objective 13 having the mirrors M5 and M6 including the beam path of the imaging light 17, is illustrated. In order to determine the working distance 27 of the penultimate mirror M5 in relation to the image plane 5, the minimum distance of a point on the mirror surface of the mirror M5 from the image plane is determined, the distance being measured perpendicular to the image plane 5. The working distance 27 between the penultimate mirror M5 and the image plane 5 is 38 mm.

Figure 4:
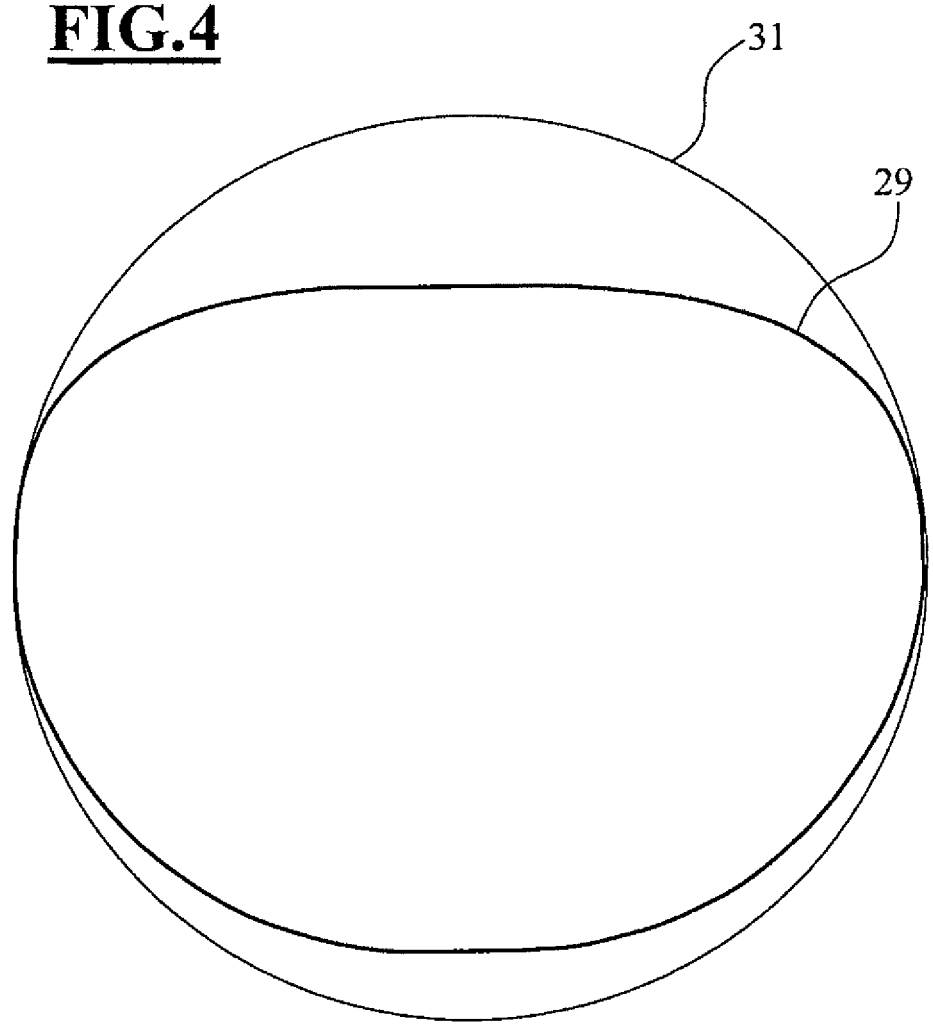
FIG. 4 shows an illuminated area on the penultimate mirror of the embodiment of FIG. 1, and an auxiliary circle for determining the outside diameter of the penultimate mirror.

FIG. 4 serves to explain how the outside diameter of a mirror in the sense of this application is determined. The edge 29 of the optically used area on the penultimate mirror M5, which results for the rectangular object field 3 given complete illumination of the exit pupil, is shown. FIG. 4 also shows the auxiliary circle 31 for determining the outside diameter of the mirror M5. The auxiliary circle 31 is determined such that it encloses the illuminated area 29 and at the same time has the smallest radius. The outside diameter is 166 mm.

Consequently, the ratio of the outside diameter to the working distance is 4.4 and smaller than 5.

The last mirror M6 has an outside diameter of 605 mm. Consequently, the outside diameter of the penultimate mirror M5 is smaller than the outside diameter of the last mirror M6.

Figure 5:
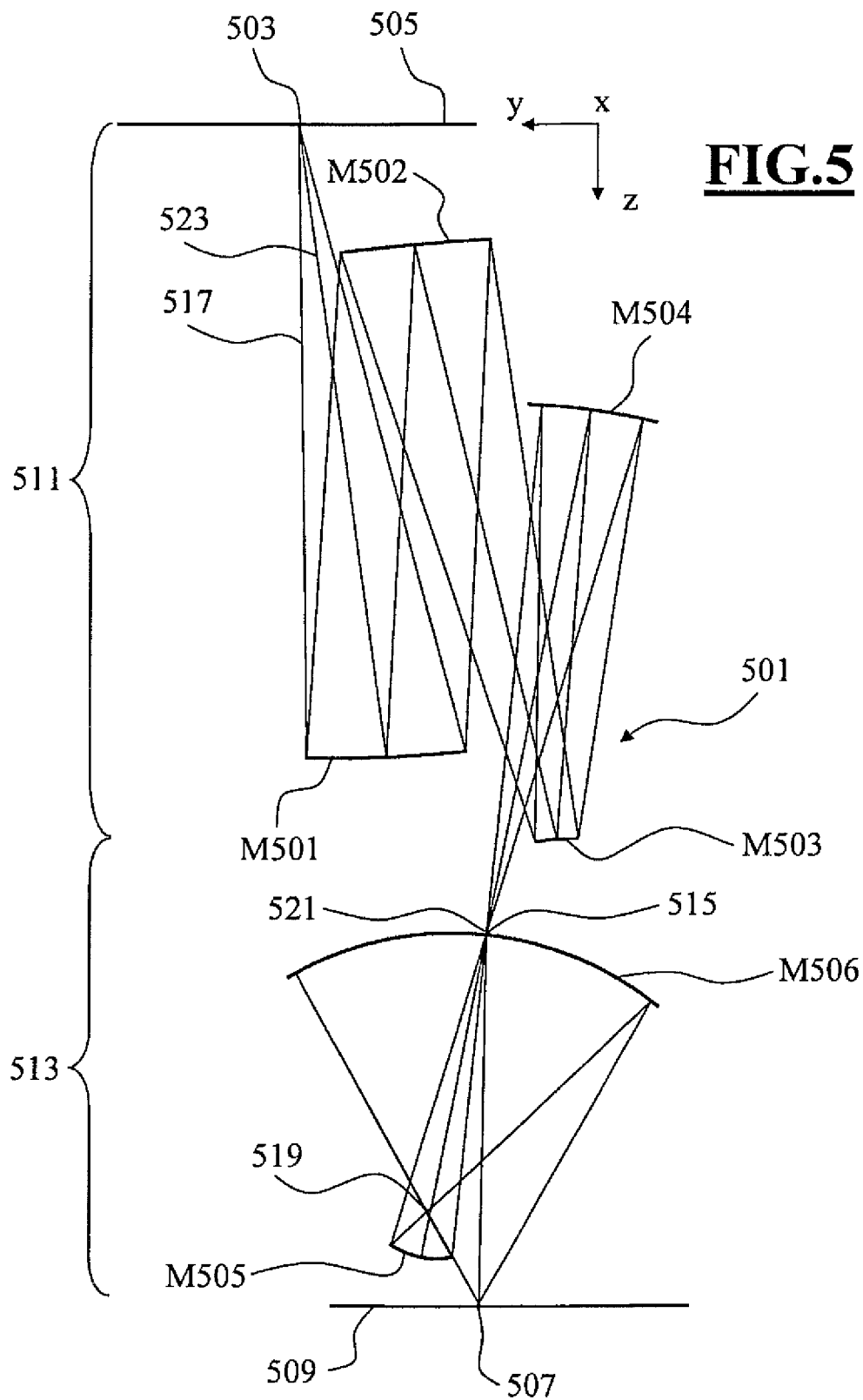
FIG. 5 shows in meridional section a further embodiment of an imaging optics having a penultimate mirror without a through-opening.

FIG. 5 shows a further embodiment of an imaging optics 501 in meridional section. The elements in FIG. 5 that correspond to the elements of FIG. 1 have the same reference signs as in FIG. 1 increased by the number 500. Reference is made to the description of FIG. 1 for a description of these elements.

The imaging optics 501 images an object field 503 in an object plane 505 into an image field 507 in an image plane 509. The imaging optics 501 has six mirrors that are enumerated from M501 to M506 in sequence in the beam path starting from the object field 503. The imaging optics 501 is a catoptric objective.

The imaging scale of the imaging optics 501 is 0.25.

The image-side numerical aperture NA is 0.5.

The imaging optics 501 includes a first partial objective 511 that images the object field 503 onto an intermediate image 515, and a second partial objective 513 which images the intermediate image 515 onto the image field 507. The first partial objective includes the four mirrors M501 to M504. The second partial objective 513 includes a penultimate mirror M505 in the beam path of the imaging light 517 between the object field 503 and the image field 507, and a last mirror M506 in the beam path. The penultimate mirror M505 images the intermediate image 515 onto a further intermediate image 519. The last mirror M506 images the further intermediate image 519 onto the image field 507.

The optical data for the imaging optics 501 are compiled in tables 5a, 5b and 5c.

The reflecting surfaces of all six mirrors M501 to M506 are designed as a free form surface that can be described by a rotationally asymmetric function.

The mirrors M501, M504, M505 and M506 are designed as concave mirrors. The mirrors M502 and M503 have a saddle surface as reflecting surface.

The mirrors M501 and M506 as well as M503 and M506 are arranged back to back as to the orientation of their reflecting surfaces.

Illustrated in the meridional section of FIG. 5 is the beam path of three individual rays that emanate from an object field point in the center of the object field 503. The three individual rays represent the chief ray 523 and two aperture rays. The chief ray 523 runs perpendicular to the image plane 507 in the image field 509. The aperture rays are at an angle to the chief ray 523 that corresponds to the image-side numerical aperture. Once again, the chief ray 523 in FIG. 5 is depicted merely for illustrative purposes since, because of a pupil obscuration of the imaging optics 501 it is not a real ray of the imaging optics 501 that is involved here, but a virtual one.

The imaging optics 501 has a negative back focus of the entrance pupil of the imaging optics 501.

The meridional section of FIG. 5 makes clear that the imaging light bundle between the mirror M502 and the mirror M503, and the imaging light bundle between the mirror M504 and the mirror M505 crossover. This distinguishes, inter alia, the embodiment of FIG. 5 from the embodiment of FIG. 1.

Inside the optically used area, the optically used areas of the mirrors M501 to M504 have no through-opening for the passage of imaging light 517. The mirror M505, that is to say the penultimate mirror in the beam path of the imaging light 517 between the object field 503 and the image field 507, also has no through-opening for the passage of the imaging light 517.

The mirror M505 is arranged outside an imaging light bundle between the last mirror M506 and the image field 507.

The mirror M506, that is to say the last mirror in the beam path of the imaging light 517 between the object field 503 and the image field 507, has a through-opening for the passage of the imaging light 517. The imaging light 517 passes through the through-opening 521 in the mirror M506 in the beam path the mirrors M504 and M505.

The intermediate image 515 lies adjacent to the through-opening 521 in the mirror M506. It is hereby possible for this through-opening 521 to be of small configuration by comparison with the used reflecting surface of the mirror M506. A pupil obscuration, that is to say the ratio of a surface, masked out via the through-opening 521, inside an exit pupil of the imaging optics 501 relative to a total area of the exit pupil is 5.2% in the case of the imaging optics 501. The ratio of the diameter of the pupil obscuration to the diameter of the exit pupil is 23%.

The working distance between the penultimate mirror M505 and the image plane 509 is 93 mm.

The outside diameter of the mirror M505 is 135 mm.

Consequently, the ratio of the outside diameter to the working distance is 1.45 and is smaller than 5, in particular smaller than 2.

The last mirror M506 has an outside diameter of 906 mm. Consequently, the outside diameter of the penultimate mirror M505 is smaller than the outside diameter of the last mirror M506.

Figure 6:
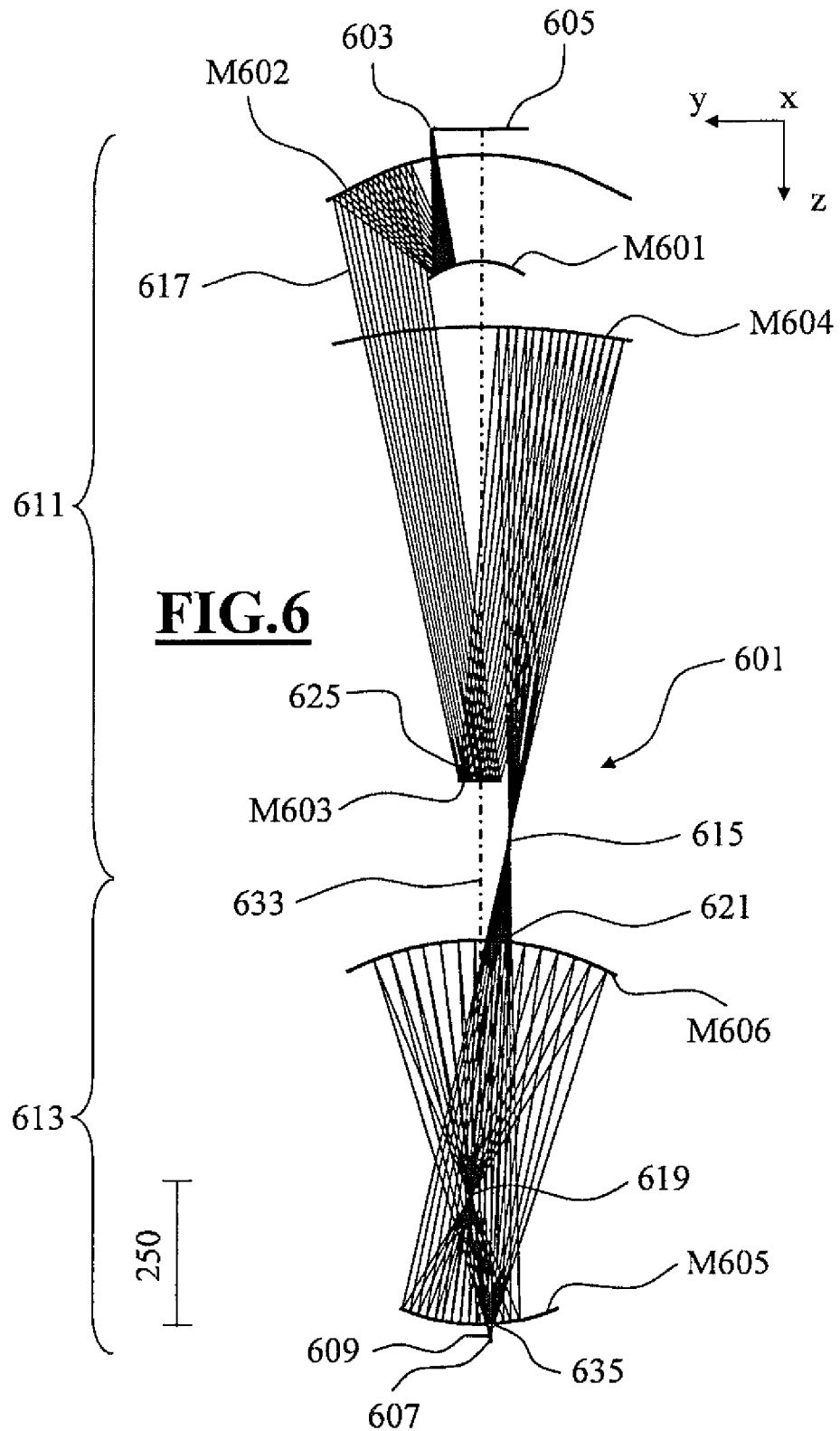
FIG. 6 shows in meridional section an embodiment of an imaging optics having a penultimate mirror with a through-opening.

FIG. 6 shows a further embodiment of an imaging optics 601 in meridional section. The elements in FIG. 6 that correspond to the elements of FIG. 1 have the same reference signs as in FIG. 1 increased by the number 600. Reference is made to the description of FIG. 1 for a description of these elements.

The imaging optics 601 images an object field 603 in an object plane 605 into an image field 607 in an image plane 609. The imaging optics 601 has six mirrors that are enumerated from M601 to M606 in sequence in the beam path starting from the object field 603. The imaging optics 601 is a catoptric objective.

The imaging optics 601 has an optical axis 633 that is perpendicular to the object plane 605 and to the image plane 609 and runs as a continuous straight line from the object plane 605 to the image plane 609. The optical axis 633 is simultaneously an axis of symmetry with which the mathematical surface descriptions of the reflecting surfaces of the six mirrors M601 to M606 are rotationally symmetric.

The object field 603 constitutes a segment of an annular field centered around the optical axis 633.

The image-side numerical aperture NA is 0.3.

The imaging optics 601 includes a first partial objective 611 that images the object field 603 onto an intermediate image 615, and a second partial objective 613 that images the intermediate image 615 onto the image field 607. The first partial objective includes the four mirrors M601 to M604. The second partial objective 613 includes a penultimate mirror M605 in the beam path of the imaging light 617 between the object field 603 and the image field 607, and a last mirror M606 in the beam path. The penultimate mirror M605 is designed as a concave mirror and images the intermediate image 615 onto a further intermediate image 619. The last mirror M606 is likewise designed as a concave mirror and images the further intermediate image 619 onto the image field 607.

The mirrors M602, M604, M605 and M606 are designed as concave mirrors. The mirror M601 is designed as a convex mirror. The mirror M603 has a virtually plane reflecting surface.

FIG. 6 illustrates the beam path of a plurality of aperture rays that emanate from an object field point inside the object field 603. The aperture rays are bounded by the mirror M603, whose mirror edge acts as an aperture stop and is arranged in a pupil plane 625. Some of the aperture rays are depicted in FIG. 6 only by way of illustration since, because of a pupil obscuration of the imaging optics 601 it is not real rays of the imaging optics 601 that are involved here, but virtual ones.

The imaging optics 601 is designed sothat the imaging light 617 runs up to the intermediate image 615 without the imaging light bundles crossing over between the individual mirrors.

The optically used areas of the mirrors M601 to M604 have no through-opening for the passage of imaging light 617 inside the optically used area.

By contrast, inside the optically used area, the penultimate mirror M605 and the last mirror M606 have a through-opening for the passage of the imaging light 617. In the beam path between the mirrors M604 and M605, the imaging light 617 passes through the through-opening 621 in the mirror M606. The imaging light 617 passes through the through-opening 635 in the mirror M605 in the beam path between the mirror M606 and the image field 607.

The penultimate mirror M605 is used around the through-opening 635, and the last mirror M606 is used around the through-opening 621.

Given that the penultimate mirror M605 has a through-opening 635, the mirrors M605 and M606 can, on the one hand, have reflecting surfaces whose respective mathematical surface description is rotationally symmetrical in relation to the optical axis 633, where on the other hand the image side numerical aperture can be increased, since the imaging light 617 need no longer be guided past the penultimate mirror M605.

An obscuration stop for shading a pupil of the imaging optics 601 can be arranged on the mirror M603, which is arranged in the pupil plane 625. The obscuration stop in this case shades at least that area of the imaging light 617 in the pupil plane 625 which makes no contribution to the imaging of the object field 603 owing to the two through-openings 621 and 635.

Figure 7:
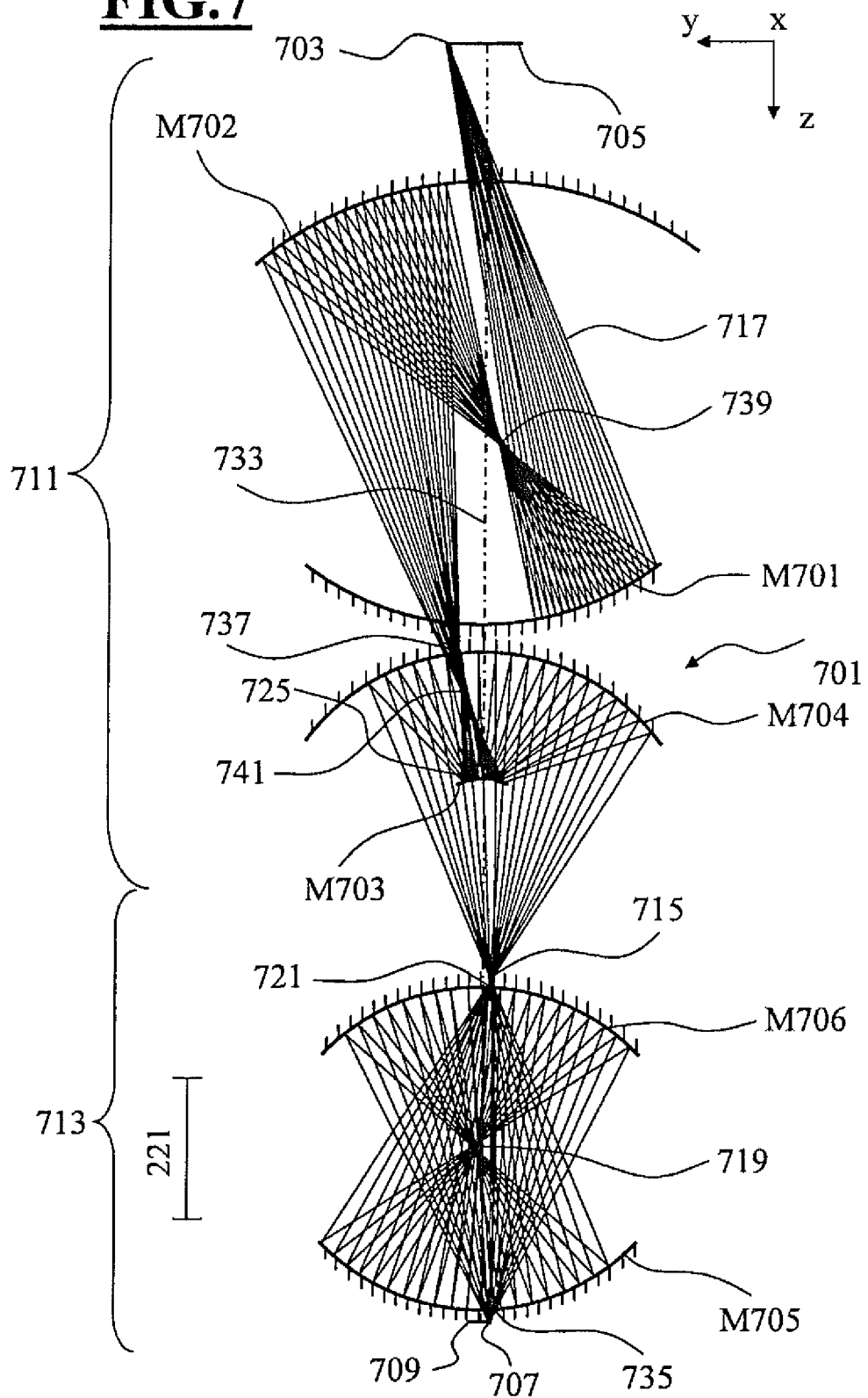
FIG. 7 shows in meridional section a further embodiment of an imaging optics having a penultimate mirror with a through-opening.

FIG. 7 shows a further embodiment of an imaging optics 701 in meridional section. The elements in FIG. 7 that correspond to the elements of FIG. 6 have the same reference signs as in FIG. 6 increased by the number 100. Reference is made to the description of FIG. 6 for a description of these elements.

The imaging optics 701 images an object field 703 in an object plane 705 into an image field 707 in an image plane 709. The imaging optics 701 has six mirrors that are enumerated from M701 to M706 in sequence in the beam path starting from the object field 703. The imaging optics 501 is a catoptric objective.

The imaging optics 701 has an optical axis 733 that is perpendicular to the object plane 705 and to the image plane 709 and runs as a continuous straight line from the object plane 705 to the image plane 709. The optical axis 733 is simultaneously an axis of symmetry with which the mathematical surface descriptions of the reflecting surfaces of the six mirrors M701 to M706 are rotationally symmetric.

The object field 703 constitutes a segment of an annular field centered around the optical axis 733.

The image-side numerical aperture NA is 0.45.

The imaging optics 701 includes a first partial objective 711 that images the object field 703 onto an intermediate image 715, and a second partial objective 713 that images the intermediate image 715 onto the image field 707. The first partial objective includes the four mirrors M701 to M704. The second partial objective 713 includes a penultimate mirror M705 in the beam path of the imaging light 717 between the object field 703 and the image field 707, and a last mirror M706 in the beam path. The penultimate mirror M705 is designed as a concave mirror and images the intermediate image 715 onto a further intermediate image 719. The last mirror M706 is likewise designed as a concave mirror and images the further intermediate image 719 onto the image field 707.

The imaging optics 701 has a total of four intermediate images and five partial objectives. The mirror M701 produces as partial objective a first intermediate image 739. The intermediate image 739 is imaged by the mirror M702 as further partial objective onto a further intermediate image 741. The intermediate image 741 is imaged by the mirrors M703 and M704 as further partial objective onto a further intermediate image 715. The intermediate image 715 is imaged by the mirror M705 as further partial objective onto a further intermediate image 719. The intermediate image 719 is imaged by the mirror M706 as further partial objective onto the image field 707. A partial objective 711 consequently includes three partial objectives, while the partial objective 713 includes two partial objectives.

The mirrors M701, M702, M704, M705 and M706 are designed as concave mirrors. Only the mirror M703 is designed as a convex mirror.

FIG. 7 illustrates the beam path of a plurality of aperture rays that emanate from an object field point inside the object field 703. The aperture rays are bounded by the mirror M703, whose mirror edge acts as a aperture stop and which is arranged in a pupil plane 725. Some of the aperture rays are depicted in FIG. 7 only for illustrative purposes since, because of a pupil obscuration of the imaging optics 701 it is not real rays of the imaging optics 701 that are involved here, but virtual ones.

The optically used areas of the mirrors M701 to M703 have no through-opening for the passage of imaging light 717 inside the optically used area.

The mirror M703 is arranged completely inside the imaging light bundle between the mirror M704 and the intermediate image 715 and therefore results in an obscuration of the pupil illumination, even if the mirror M703 has no through-opening for the passage of the imaging light 717.

Inside the optically used area, the mirror M704 has a through-opening for the passage of the imaging light 717. The imaging light 717 passes through the through-opening 737 in the mirror M704 in the beam path between the mirrors M702 and M703.

The mirror M704 is used around the through-opening 737.

Given that mirror M704 has a through-opening 737, the mirrors M703 and M704 can, on the one hand, have reflecting surfaces whose respective mathematical surface description is rotatationally symmetrical in relation to the optical axis 733, on the other hand the numerical aperture in the intermediate image 715 can be increased, since the imaging light 717 need no longer be guided past the mirror M704.

As in the embodiment of FIG. 7, the penultimate mirror M705 and the last mirror M706 have a through-opening for the passage of the imaging light 717 inside the optically used area. The imaging light 717 passes through the through-opening 721 in the mirror M706 in the beam path between the mirrors M704 and M705. The imaging light 717 passes through the through-opening 735 in the mirror M705 in the beam path between the mirror M706 and the image field 707.

The penultimate mirror M705 is used around the through-opening 735, and the last mirror M706 is used around the through-opening 721.

An obscuration stop for shading a pupil of the imaging optics 701 can be arranged on the mirror M703, which is arranged in the pupil plane 725. The obscuration stop in this case shades at least that area of the imaging light 717 in the pupil plane 725 which makes no contribution to the imaging of the object field 703 owing to the three through-openings 721, 735 and 737 and the mirror M703 arranged inside the imaging light bundle.

Figure 8:
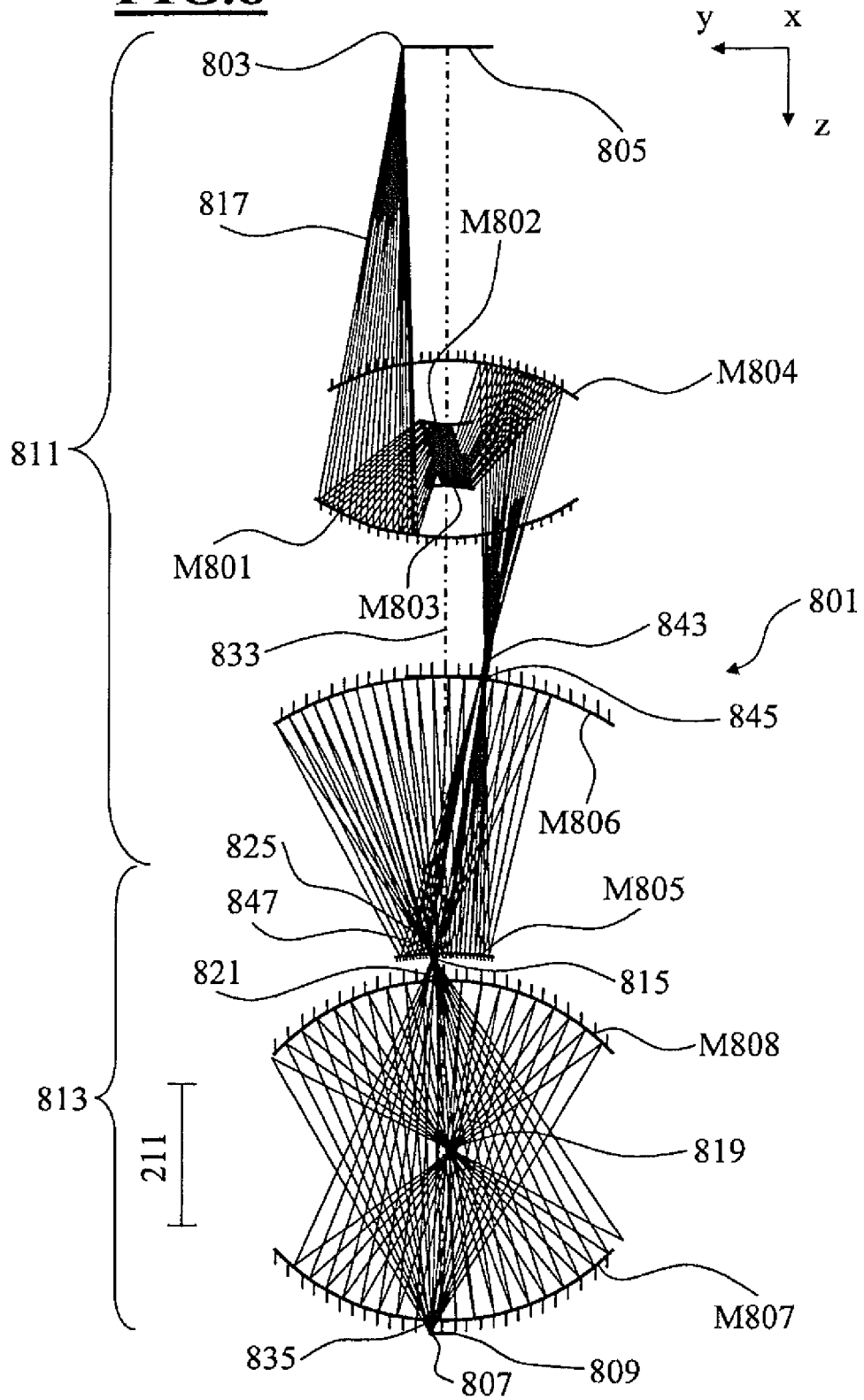
FIG. 8 shows in meridional section a further embodiment of an imaging optics having a penultimate mirror with a through-opening.

FIG. 8 shows a further embodiment of an imaging optics 801 in meridional section. The elements in FIG. 8 that correspond to the elements of FIG. 7 have the same reference signs as in FIG. 7 increased by the number 100. Reference is made to the description of FIG. 7 for a description of these elements.

The imaging optics 801 images an object field 803 in an object plane 805 into an image field 807 in an image plane 809. The imaging optics 801 has eight mirrors that are enumerated from M801 to M808 in sequence in the beam path starting from the object field 803. The imaging optics 801 is a catoptric objective.

The imaging optics 801 has an optical axis 833 that is perpendicular to the object plane 805 and to the image plane 809 and runs as a continuous straight line from the object plane 805 to the image plane 809. The optical axis 833 is simultaneously an axis of symmetry with which the mathematical surface descriptions of the reflecting surfaces of the eight mirrors M801 to M808 are rotationally symmetric.

The object field 803 constitutes a segment of an annular field centered around the optical axis 833.

The imaging scale of the imaging optics 801 is 0.25.

The imaging scale of the numerical aperture NA is 0.5.

The imaging optics 801 includes a first partial objective 811 that images the object field 803 onto an intermediate image 815, and a second partial objective 813 which images the intermediate image 815 onto the image field 807. The first partial objective includes the six mirrors M801 to M806. The second partial objective 813 includes a penultimate mirror M807 in the beam path of imaging light 817 between the object field 803 and the image field 807, and a last mirror M808 in the beam path. The penultimate mirror M807 is designed as a concave mirror and images the intermediate image 815 onto a further intermediate image 819. The last mirror M806 is likewise designed as a concave mirror and images the further intermediate image 819 onto the image field 807.

The imaging optics 801 has a total of three intermediate images and four partial objectives. The mirrors M801 to M804 produce as partial objective a first intermediate image 843. The intermediate image 843 is imaged by the mirrors M805 and M806 as further partial objective onto a further intermediate image 815. The intermediate image 815 is imaged by the mirror M807 as further partial objective onto a further intermediate image 819. The intermediate image 819 is imaged by the mirror M808 as further partial objective onto the image field 807. The partial objective 811 and the partial objective 813 consequently includes two partial objectives in each case.

The mirrors M801, M804, M806, M807 and M808 are designed as concave mirrors. The mirrors M802, M803 and M805 are designed as convex mirrors.

FIG. 8 illustrates the beam path of a plurality of aperture rays that emanate from an object field point inside the object field 803. The aperture rays are bounded by the mirror M805, whose mirror edge acts as a aperture stop and which is arranged in a pupil plane 825. Some of the aperture rays are depicted in FIG. 8 only for illustrative purposes since, because of a pupil obscuration of the imaging optics 801 it is not real rays of the imaging optics 801 that are involved here, but virtual ones.

The optically used areas of the mirrors M801 to M804 have no through-opening for the passage of imaging light 817 inside the optically used area.

The mirror M805 and the mirror M806 have a through-opening for the passage of the imaging light 817 inside the optically used area. The imaging light 817 passes through the through-opening 845 in the mirror M806 in the beam path between the mirrors M804 and M805. The imaging light 817 passes through the through-opening 847 in the mirror M805 in the beam path between the mirror M806 and the intermediate image 815.

The mirror M805 is used around the through-opening 847, and the mirror M806 is used around the through-opening 845.

As in the embodiment of FIG. 7, the penultimate mirror M807 and the last mirror M808 have a through-opening for the passage of the imaging light 817 inside the optically used area. The imaging light 817 passes through the through-opening 821 in the mirror M808 in the beam path between the mirrors M806 and M807. The imaging light 817 passes through the through-opening 835 in the mirror M807 in the beam path between the mirror M808 and the image field 807.

The penultimate mirror M807 is used around the through-opening 835, and the last mirror M808 is used around the through-opening 821.

Figure 9:
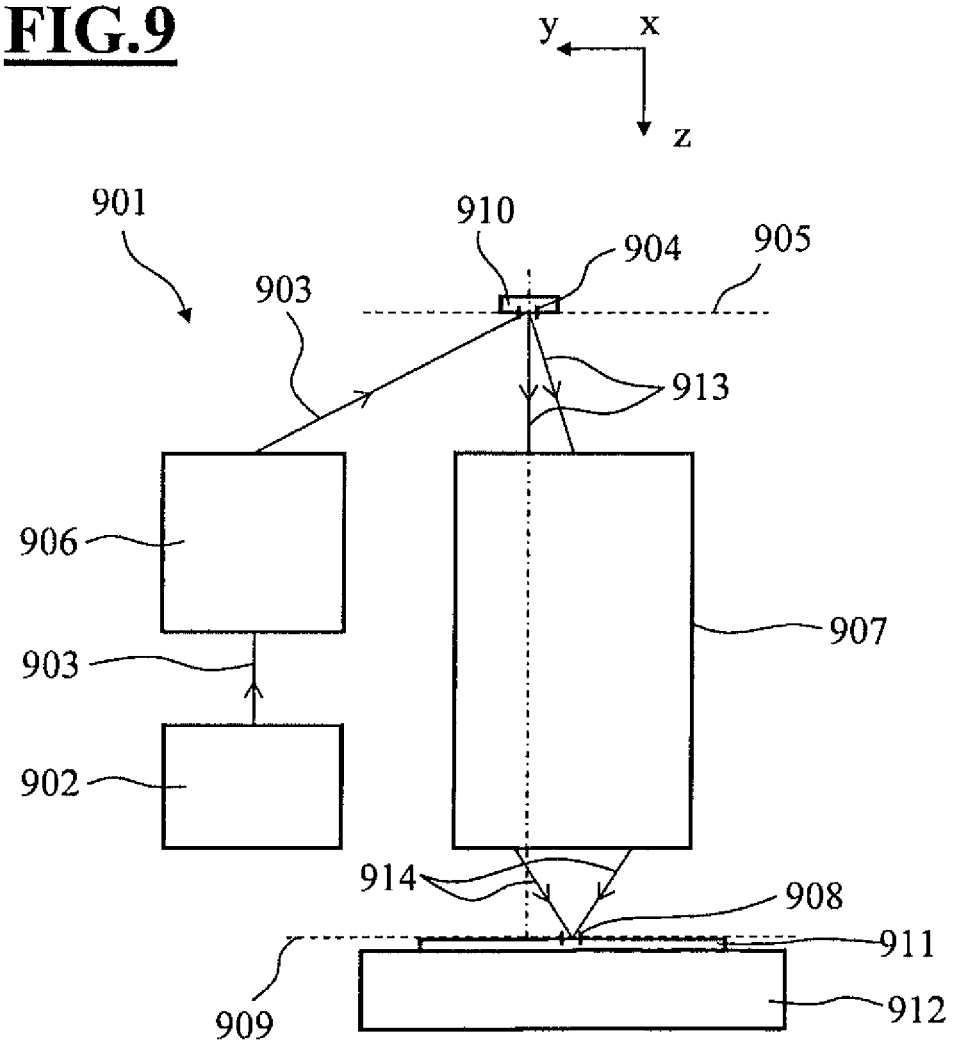
FIG. 9 shows a schematic of a projection exposure apparatus for EUV microlithography.

FIG. 9 shows a projection exposure apparatus 901 for microlithography in which it is possible to make use of one of the previously described embodiments for an imaging optics as projection objective 907. The projection exposure apparatus 901 has a light source 902 for generating illumination light 903. The light source 902 is an EUV light source that generates light in a wavelength region of, for example, between 5 nm and 30 nm, in particular between 5 nm and 15 nm. The light source 902 can, in particular, be a light source with a wavelength of 13.5 nm, or a light source with a wavelength of 6.9 nm. Other EUV wavelengths are also possible. In general, even arbitrary wavelengths, for example visible wavelengths or else other wavelengths that can be used in microlithography and are available for the suitable laser light sources and/or LED light sources (for example 365 nm, 248 nm, 193 nm, 157 nm, 129 nm, 109 nm) are a possibility for the illumination light 903. A beam path of the illumination light 903 is illustrated schematically in FIG. 9.

An illumination optics 906 serves the purpose of guiding the illumination light 903 from the light source 902 to an object field 904 in an object plane 905. With the aid of a projection objective 907, the object field 904 is imaged into an image field 908 in an image plane 909 with a prescribed reduction scale. One of the embodiments for an imaging optics that is illustrated in FIGS. 1 to 8 can be used for the projection objective 907. The image field 908 has an extent of between 13 mm and 26 mm in the x-direction, and an extent of between 2 mm and 6 mm in the y-direction, for example an x-extent of 26 mm and a y-extent of 2 mm. The object field 904 and the image field 908 are rectangular when use is made as projection objective 907 of an imaging optics according to an embodiment of FIG. 1 or FIG. 5. The object field 904 and the image field 908 have the shape of an annular segment when use is made as projection objective 907 of an imaging optics according to an embodiment of FIG. 6, FIG. 7 or FIG. 8. The imaging plane 909 is arranged parallel to the object plane 905. What is imaged hereby is a section of a reflection mask 910, also denoted as a reticle, that coincides with the object field 904.

The projection objective 907 images onto the surface of a substrate 911 in the form of a wafer that is supported by a substrate holder 912. Illustrated schematically in FIG. 9 are a ray bundle 913 of the imaging light that runs into the projection objective 907 between the reticle 910 and the projection objective 907, and a ray bundle 914 of the imaging light that runs out of the projection objective 907 between the projective objective 907 and the substrate 911.

In order to facilitate the description of the projection exposure apparatus 901 as well as the various designs of the projection objective 907, the drawing specifies a Cartesian xyz-coordinate system that defines the respective spatial relationship of the components illustrated in the figures. The x-direction in FIG. 9 emerges perpendicularly from the plane of the drawing. The y-direction runs to the left, and the z-direction runs downward.

The projection exposure apparatus 901 is of the scan and step type. Both the reticle 910 and the wafer 911 are scanned in the y-direction during operation of the projection exposure apparatus 901. After the exposure of a microelectronic component, the wafer 911 is displaced in stepwise fashion in the x- or y-direction. It is also possible to employ nothing but a stepper operation of the projection exposure apparatus 901, in which case only a stepwise displacement of the wafer 911 in the x- or y-direction takes place between individual exposures of the wafer 911.

The projection exposure apparatus 901 is used in the following way in order to produce a microstructured component: firstly, the reflection mask 901 or the reticle, and the substrate or the wafer 911 are prepared. Subsequently, a structure on the reticle 910 is projected onto a photosensitive layer of the wafer 911 with the aid of the projection exposure apparatus 901. The photosensitive layer is then developed in order to produce a microstructure on the wafer 911 and thus the microstructured component.

TABLE 1a

| Surface | Radius (1/c) | Distance |
|---|---|---|
| Object plane | | 1200.000 |
| Mirror M1 | −1097.988 | −644.270 |
| Mirror M2 | −192.541 | 646.391 |

TABLE 1a-continued

| Surface | Radius (1/c) | Distance |
|---|---|---|
| Mirror M3 | 2386.515 | −579.822 |
| Mirror M4 | 1687.781 | 1337.701 |
| Mirror M5 | −162.033 | −560.000 |
| Mirror M6 | 534.451 | 600.000 |
| Image plane | | 0.000 |

TABLE 1c

| | Mirror M1 | Mirror M2 | Mirror M3 |
|---|---|---|---|
| Y-decentering | −58.640 | −358.072 | −566.299 |
| X-rotation | 8.474 | 3.576 | 2.316 |

| | Mirror M4 | Mirror M5 | Mirror M6 | Image plane |
|---|---|---|---|---|
| Y-decentering | −805.664 | −584.238 | −677.862 | 0.000 |
| X-rotation | 15.992 | 8.361 | 5.067 | 0.000 |

TABLE 1b

| Coefficient | Mirror M1 | Mirror M2 | Mirror M3 |
|---|---|---|---|
| k | 0.000000E+00 | 7.614254E−01 | −2.231578E−01 |
| Y | 0.000000E+00 | 0.000000E+00 | 0.000000E+00 |
| X2 | −3.175191E+00 | −9.404183E−01 | −5.968017E+01 |
| Y2 | 2.673919E+00 | 2.540929E+00 | −3.595254E+00 |
| X2Y | 7.598934E−01 | 1.234404E+00 | 5.261066E+00 |
| Y3 | 3.134722E−01 | 2.611248E+00 | −2.280984E+00 |
| X4 | −1.070578E−01 | 5.048291E−01 | −9.204780E−01 |
| X2Y2 | −2.475366E−02 | −8.528200E−02 | 1.175973E+00 |
| Y4 | −2.477462E−02 | 4.161299E−02 | −3.919965E+00 |
| X4Y | 2.363415E−02 | 4.444404E−02 | 1.769818E−01 |
| X2Y3 | 7.931374E−02 | 3.633260E−02 | −2.168259E+00 |
| Y5 | −1.933710E−02 | 7.150122E−07 | −9.275292E−01 |
| X6 | −5.222130E−03 | 4.653851E−02 | −5.845299E−02 |
| X4Y2 | −8.934134E−03 | −3.376644E−02 | −2.064144E−02 |
| X2Y4 | 9.428045E−03 | −2.390727E−03 | 2.086298E−01 |
| Y6 | −3.387531E−02 | 7.506335E−04 | 6.829817E+00 |
| X6Y | 2.649098E−04 | −5.605633E−02 | 5.318246E−02 |
| X4Y3 | 4.789172E−03 | 1.493552E−02 | −6.423818E−02 |
| X2Y5 | 1.965443E−02 | 3.202505E−04 | 4.040540E+00 |
| Y7 | 1.148430E−02 | −2.666828E−07 | 7.304437E+00 |
| X8 | −1.022932E−03 | −3.838620E−03 | −2.994799E−04 |
| X6Y2 | −2.756422E−03 | 2.405787E−02 | −1.894891E−02 |
| X4Y4 | 1.131450E−03 | −2.341878E−03 | 7.851206E−01 |
| X2Y6 | 1.037513E−02 | 1.269213E−04 | 5.922730E+00 |
| Y8 | 6.343536E−03 | 5.753904E−05 | 2.303145E+00 |
| X8Y | 4.840563E−04 | 1.901755E−02 | 1.261376E−02 |
| X6Y3 | 2.644192E−03 | 1.203143E−03 | −9.499187E−02 |
| X4Y5 | 2.390901E−03 | 2.978998E−03 | 1.289057E+00 |
| X2Y7 | −1.755797E−02 | 4.505993E−04 | −3.986287E−01 |
| Y9 | −3.766585E−03 | 2.764252E−05 | 0.000000E+00 |
| X10 | 4.484576E−04 | −5.911396E−03 | 0.000000E+00 |
| X8Y2 | 9.703681E−04 | −1.009886E−02 | 0.000000E+00 |
| X6Y4 | −2.002132E−03 | −2.651927E−03 | 0.000000E+00 |
| X4Y6 | 4.228360E−03 | −1.150028E−03 | 0.000000E+00 |
| X2Y8 | −1.921653E−02 | −5.517322E−05 | 0.000000E+00 |
| Y10 | 0.000000E+00 | 0.000000E+00 | 0.000000E+00 |
| $R_{norm}$ | 2.591205E+02 | 3.660114E+01 | 3.069451E+02 |

| Coefficient | Mirror M4 | Mirror M5 | Mirror M6 |
|---|---|---|---|
| k | 6.700154E−02 | 2.907228E−01 | −3.523884E−03 |
| Y | 0.000000E+00 | 0.000000E+00 | 0.000000E+00 |
| X2 | −8.001595E+00 | 1.484272E+00 | 3.008786E+00 |
| Y2 | 8.080696E+00 | −2.772959E−01 | 7.419503E−01 |
| X2Y | 5.868863E−01 | −1.960667E−01 | −4.973970E−01 |
| Y3 | −3.805429E+00 | 1.261692E−01 | 4.986965E−01 |
| X4 | −5.572204E−01 | 6.437261E−01 | 2.867809E−01 |
| X2Y2 | 3.914341E−01 | 6.734978E−01 | 6.502053E−01 |
| Y4 | 1.189709E−01 | 2.083425E−01 | 2.268834E−02 |
| X4Y | 1.900167E−02 | −1.135971E−01 | −1.178155E−01 |
| X2Y3 | −1.025108E−01 | −5.091745E−03 | −9.216217E−02 |

TABLE 1b-continued

| | | | |
|---|---|---|---|
| Y5 | −1.385758E−02 | 3.018875E−02 | 9.479779E−02 |
| X6 | −2.913527E−02 | 1.111013E−01 | 3.661939E−02 |
| X4Y2 | 6.674575E−02 | 1.717109E−01 | 1.786899E−01 |
| X2Y4 | 1.679054E−02 | 1.491981E−01 | 1.310040E−01 |
| Y6 | 2.664985E−02 | 4.301397E−02 | 3.464432E−03 |
| X6Y | −1.284008E−03 | 2.049202E−03 | −1.258340E−02 |
| X4Y3 | −2.185333E−02 | −2.521656E−02 | −5.609640E−02 |
| X2Y5 | 1.787572E−02 | −1.365778E−02 | 1.088687E−02 |
| Y7 | 7.514803E−03 | 5.978323E−03 | 2.357020E−02 |
| X8 | −7.196757E−04 | 1.731865E−02 | 5.146803E−03 |
| X6Y2 | 7.958001E−03 | 5.363823E−02 | 3.058861E−02 |
| X4Y4 | 3.003023E−03 | 7.741436E−02 | 6.416687E−02 |
| X2Y6 | 4.614952E−03 | 3.730962E−02 | 3.068322E−02 |
| Y8 | 7.292743E−03 | −9.625925E−04 | 4.624213E−04 |
| X8Y | 5.994506E−03 | −9.656234E−03 | −1.186922E−02 |
| X6Y3 | −7.648108E−03 | −2.587871E−02 | −4.417958E−02 |
| X4Y5 | −3.052750E−03 | −1.662925E−02 | −3.565447E−02 |
| X2Y7 | −1.347302E−04 | 1.552501E−02 | −2.564864E−03 |
| Y9 | −3.471531E−03 | 1.695728E−02 | 1.600667E−03 |
| X10 | 1.694932E−04 | 4.194484E−03 | 2.996137E−03 |
| X8Y2 | 6.719652E−03 | 1.490523E−02 | 1.919360E−02 |
| X6Y4 | −8.507406E−03 | 1.972569E−02 | 4.182334E−02 |
| X4Y6 | 6.459312E−03 | 5.900710E−02 | 3.698433E−02 |
| X2Y8 | 0.000000E+00 | 3.583604E−04 | 4.326934E−03 |
| Y10 | 0.000000E+00 | 3.933862E−04 | −2.961759E−03 |
| $R_{norm}$ | 2.392278E+02 | 7.193605E+01 | 3.043808E+02 |

TABLE 5a

| Surface | Radius (1/c) | Distance |
|---|---|---|
| Object plane | | 1318.367 |
| Spiegel M501 | −1387.203 | −1069.759 |
| Spiegel M502 | −1919.296 | 1240.627 |
| Spiegel M503 | 4203.149 | −895.105 |
| Spiegel M504 | 1537.304 | 1766.831 |
| Spiegel M505 | −364.244 | −671.725 |
| Spiegel M506 | 672.196 | 768.007 |
| Image plane | | 0.000 |

TABLE 5c

| | Mirror M501 | Mirror M502 | Mirror M503 |
|---|---|---|---|
| Y-decentering | −75.284 | −130.437 | −427.373 |
| X-rotation | −2.524 | −5.254 | −4.596 |

| | Mirror M504 | Mirror M505 | Mirror M506 | Image plane |
|---|---|---|---|---|
| Y-decentering | −494.163 | −150.801 | −281.343 | 0.000 |
| X-rotation | 7.632 | 10.998 | 5.971 | 0.000 |

TABLE 5b

| Coefficient | Mirror M501 | Mirror M502 | Mirror M503 |
|---|---|---|---|
| K | 0.000000E+00 | 0.000000E+00 | 0.000000E+00 |
| Y | 0.000000E+00 | 0.000000E+00 | 0.000000E+00 |
| X2 | −6.050302E−06 | −1.113495E−03 | −3.715924E−04 |
| Y2 | 1.575104E−04 | 3.848758E−04 | 7.254278E−04 |
| X2Y | −2.128461E−09 | 1.903891E−06 | 8.789676E−08 |
| Y3 | −3.547877E−08 | −4.176122E−08 | −8.509231E−07 |
| X4 | 4.627802E−11 | 2.808258E−08 | −3.516451E−11 |
| X2Y2 | 9.315623E−11 | −1.055891E−09 | −9.998132E−10 |
| Y4 | 8.478484E−11 | −1.973709E−12 | 4.410751E−09 |
| X4Y | 2.584634E−14 | 1.961535E−11 | 7.604426E−14 |
| X2Y3 | 1.941951E−12 | 4.495629E−12 | −7.928494E−13 |
| Y5 | 3.103848E−13 | 3.527934E−13 | −1.953973E−11 |
| X6 | 0.000000E+00 | 0.000000E+00 | 1.319265E−17 |
| X4Y2 | 0.000000E+00 | 0.000000E+00 | 3.531512E−16 |
| X2Y4 | 0.000000E+00 | 0.000000E+00 | −1.955889E−14 |

TABLE 5b-continued

| Y6 | 0.000000E+00 | 0.000000E+00 | 1.573791E−13 |
| Nradius | 1.000000E+00 | 1.000000E+00 | 1.000000E+00 |

| Coefficient | Mirror M504 | Mirror M505 | Mirror M506 |
|---|---|---|---|
| K | 0.000000E+00 | 0.000000E+00 | 0.000000E+00 |
| Y | 0.000000E+00 | 0.000000E+00 | 0.000000E+00 |
| X2 | −2.679056E−04 | −1.785454E−03 | 5.520469E−06 |
| Y2 | 5.709471E−05 | −1.593041E−03 | 3.273816E−06 |
| X2Y | 1.446058E−08 | 2.245481E−07 | 4.108873E−09 |
| Y3 | −4.986077E−08 | 3.122043E−06 | −4.634079E−10 |
| X4 | −1.174864E−10 | −5.543813E−09 | 4.138197E−12 |
| X2Y2 | −1.279432E−10 | −2.864377E−08 | 4.807037E−12 |
| Y4 | 1.185544E−10 | −1.594018E−08 | 1.954928E−12 |
| X4Y | 1.772174E−13 | 0.000000E+00 | 0.000000E+00 |
| X2Y3 | −3.867885E−13 | 0.000000E+00 | 0.000000E+00 |
| Y5 | 1.316996E−13 | 0.000000E+00 | 0.000000E+00 |
| X6 | 0.000000E+00 | 0.000000E+00 | 0.000000E+00 |
| X4Y2 | 0.000000E+00 | 0.000000E+00 | 0.000000E+00 |
| X2Y4 | 0.000000E+00 | 0.000000E+00 | 0.000000E+00 |
| Y6 | 0.000000E+00 | 0.000000E+00 | 0.000000E+00 |
| Nradius | 1.000000E+00 | 1.000000E+00 | 1.000000E+00 |

What is claimed is:

1. An imaging optics, comprising:
a plurality of mirrors configured to image light along a beam path from an object field in an object plane of the imaging optics into an image field in an image plane of the imaging optics,
wherein:
the imaging optics comprises a first partial objective configured to image the object field into a first intermediate image;
the imaging optics comprises second partial objective configured to image the first intermediate image into the image field;
the second partial objective comprises a penultimate mirror in the beam path and a last mirror in the beam path;
the penultimate mirror is configured to image the first intermediate image into a second intermediate image;
the last mirror is configured to image the second intermediate image into the image field; and
the imaging optics is a microlithography projection objective.

2. The imaging optics of claim 1, wherein the last mirror has a through-opening along the beam path.

3. The imaging optics of claim 1, wherein a reflecting surface of the penultimate mirror inside an optically used area of the penultimate mirror has no through-opening along the beam path.

4. The imaging optics of claim 3, wherein the penultimate mirror is outside the beam path between the last mirror and the image field.

5. The imaging optics of claim 3, wherein the penultimate mirror has an outside diameter, the penultimate mirror has a working distance from the image plane, and a ratio of the outside diameter to the working distance is less than 5.

6. The imaging optics of claim 3, wherein the penultimate mirror has an outside diameter which is smaller than an outside diameter of the last mirror.

7. The imaging optics of claim 1, wherein a reflecting surface of the penultimate mirror inside an optically used area of the penultimate mirror has a through-opening along the beam path.

8. The imaging optics of claim 1, wherein at least one the mirrors has a free form surface that can be described by a rotationally asymmetric function.

9. The imaging optics of claim 1, wherein the first partial objective comprises four mirrors.

10. The imaging optics of claim 1, wherein the first partial objective comprises precisely four mirrors.

11. The imaging optics of claim 1, wherein the imaging optics is a catoptric microlithography projection objective.

12. The imaging optics of claim 1, wherein a numerical aperture in the image plane is at least 0.3.

13. An imaging optics, comprising:
a plurality of mirrors configured to image light along a beam path from an object field in an object plane of the imaging optics into an image field in an image plane of the imaging optics,
wherein:
the imaging optics comprises a first partial objective configured to image the object field into a first intermediate image;
the imaging optics comprises second partial objective configured to image the first intermediate image into the image field;
the second partial objective comprises a penultimate mirror in the beam path and a last mirror in the beam path;
the penultimate mirror is configured to image the first intermediate image into a second intermediate image;
the last mirror is configured to image the second intermediate image into the image field;
the last mirror has a through-opening along the beam path;
a reflecting surface of the penultimate mirror inside an optically used area of the penultimate mirror has no through-opening along the beam path;
the penultimate mirror is outside the beam path between the last mirror and the image field;
the penultimate mirror has an outside diameter, the penultimate mirror has a working distance from the image plane, and a ratio of the outside diameter to the working distance is less than 5;
the penultimate mirror has an outside diameter which is smaller than an outside diameter of the last mirror; and
the imaging optics is a microlithography projection objective.

14. The imaging optics of claim 13, wherein the imaging optics is a catoptric microlithography projection objective, a numerical aperture in the image plane is at least 0.3, at least one the mirrors has a free form surface that can be described by a rotationally asymmetric function, and the first partial objective comprises four mirrors.

15. A projection exposure apparatus, comprising:
a projection objective having an object field and an image field; and
an illumination optics configured to guide illumination light to the object field of the projection objective,
wherein:
the projection exposure apparatus is a microlithography projection exposure apparatus;
the projection objective comprises a plurality of mirrors configured to image light along a beam path from an object field in the object plane of the projection objective into an image field in the image plane of the projection objective;
the projection objective comprises a first partial objective configured to image the object field into a first intermediate image;

the projection objective comprises second partial objective configured to image the first intermediate image into the image field;

the second partial objective comprises a penultimate mirror in the beam path and a last mirror in the beam path;

the penultimate mirror is configured to image the first intermediate image into a second intermediate image; and the last mirror is configured to image the second intermediate image into the image field.

16. The projection exposure apparatus of claim 15, further comprising a light source configured to provide the illumination light.

17. The projection exposure apparatus of claim 16, wherein the illumination light has a wavelength between 5 and 30 nm.

18. A method, comprising:

using an illumination system of a microlithography projection exposure apparatus to illuminate a reticle; and using a projection objective of the microlithography projection exposure apparatus to project a structure on the reticle onto a photosensitive layer, wherein:

the projection objective comprises a plurality of mirrors configured to image light along a beam path from an object field in the object plane of the projection objective into an image field in the image plane of the projection objective;

the projection objective comprises a first partial objective configured to image the object field into a first intermediate image;

the projection objective comprises second partial objective configured to image the first intermediate image into the image field;

the second partial objective comprises a penultimate mirror in the beam path and a last mirror in the beam path;

the penultimate mirror is configured to image the first intermediate image into a second intermediate image; and the last mirror is configured to image the second intermediate image into the image field.

19. A projection exposure apparatus, comprising:

a projection objective according to claim 13; and an illumination optics configured to guide illumination light to the object field of the projection objective, wherein the projection exposure apparatus is a microlithography projection exposure apparatus.

20. A method of using a projection exposure apparatus comprising a projection objective and an illumination optics, the method comprising:

using the illumination system to illuminate a reticle; and using the projection objective to project a structure on the reticle onto a photosensitive layer, wherein the projection objective is a projection objective according to claim 13.

* * * * *

UNITED STATES PATENT AND TRADEMARK OFFICE
CERTIFICATE OF CORRECTION

Page 1 of 1

PATENT NO. : 9,013,677 B2
APPLICATION NO. : 13/602553
DATED : April 21, 2015
INVENTOR(S) : Mann et al.

It is certified that error appears in the above-identified patent and that said Letters Patent is hereby corrected as shown below:

On the title page item [56], Page 2, Column 1, Line 4, delete "A. cademic" insert --Academic--;

In the specification

Column 4, Line 22, delete "polynominals" insert --polynomials--;

Column 8, Line 11, delete "is" insert --5 is--;

Column 10, Line 33, delete "sothat" insert --so that--;

Column 12, Line 12, delete "rotatationally" insert --rotationally--;

In the claims

Column 17, Line 65, Claim 8, delete "one" insert --one of--;

Column 18, Line 49, Claim 14, delete "one" insert --one of--.

Signed and Sealed this
Twenty-ninth Day of December, 2015

Michelle K. Lee
*Director of the United States Patent and Trademark Office*